US008696389B2

(12) United States Patent
Mason et al.

(10) Patent No.: US 8,696,389 B2
(45) Date of Patent: Apr. 15, 2014

(54) CARD EDGE CONNECTOR

(75) Inventors: Jeffery Walter Mason, North Attleboro, MA (US); William Brian Murphy, Brockton, MA (US); Wayne Stewart Allen, III, Whitman, MA (US)

(73) Assignee: Tyco Electronics Corporation, Berwyn, PA (US)

(*) Notice: Subject to any disclaimer, the term of this patent is extended or adjusted under 35 U.S.C. 154(b) by 162 days.

(21) Appl. No.: 13/249,945

(22) Filed: Sep. 30, 2011

(65) Prior Publication Data

US 2013/0084754 A1 Apr. 4, 2013

(51) Int. Cl.
*H01R 24/00* (2011.01)

(52) U.S. Cl.
USPC .......... 439/637

(58) Field of Classification Search
USPC .......... 439/637, 630, 60, 67, 77, 492–495
See application file for complete search history.

(56) References Cited

U.S. PATENT DOCUMENTS

| | | | | |
|---|---|---|---|---|
| 3,866,319 | A | 2/1975 | Steigerwald | |
| 4,367,006 | A * | 1/1983 | Rehbogen et al. | 439/495 |
| 5,106,311 | A * | 4/1992 | Yodogawa et al. | 439/77 |
| 5,259,768 | A * | 11/1993 | Brunker et al. | 439/60 |
| 5,775,938 | A * | 7/1998 | Noro et al. | 439/495 |
| 5,906,518 | A * | 5/1999 | Sun | 439/660 |
| 5,919,064 | A * | 7/1999 | Petersen et al. | 439/637 |
| 6,099,328 | A * | 8/2000 | Nelson et al. | 439/101 |
| 6,994,563 | B2 * | 2/2006 | Amini et al. | 439/62 |
| 7,198,519 | B2 * | 4/2007 | Regnier et al. | 439/637 |

* cited by examiner

*Primary Examiner* — Xuong Chung Trans

(57) ABSTRACT

A card edge connector for mating to a flex circuit includes a housing having a front, a top and a bottom. The housing has a slot between the top and the bottom. The slot is open at the front. The slot is configured to receive a flex circuit therein. Upper contacts are held by the housing between the slot and the top. The upper contacts are exposed in the slot for mating with an upper surface of the flex circuit. Lower contacts are held by the housing between the slot and the bottom. The lower contacts are exposed in the slot for mating with a lower surface of the flex circuit.

19 Claims, 2 Drawing Sheets

100 102 138 140 136 144 146 148 130 132 134 142 106 118 114 120 104 112 110

100 104 174 190 170 130 138 144 160 178 188 162 172 182 134 132 176 184 154 186 156 180 192 114 110 112

CARD EDGE CONNECTOR

BACKGROUND OF THE INVENTION

The subject matter herein relates generally to connectors for flex circuits.

Flex circuits use a flexible plastic substrate having printed circuits thereon. The flexible plastic substrate is capable of being routed between two electronic components while being conformed to a desired shape or flexed during use. The flex circuits are mated with the electronic component at a separable interface by pressing the side of the flex circuit into the electronic component. Such mating schemes only allow connection to one side of the flex circuit. The real estate available for mating to the electronic component is limited.

One type of connector is known as a card edge connector and is in wide use today. Card edge connectors typically include a connector housing having a slot that receives an edge of a printed circuit board. Heretofore, card edge connectors have not been usable with flex circuits due in part to the difficulty of loading a flex circuit into the slot of the card edge connector. The loading force is too high for the flexible plastic substrate.

A need remains for a connector for a flex circuit having an increase in the number of connector positions between the connector and the flex circuit. A need remains for a high density flex circuit having an increased number of mating interfaces for mating with a connector. A need remains for a card edge connector configured for mating with a flex circuit.

BRIEF DESCRIPTION OF THE INVENTION

In one embodiment, a card edge connector for mating to a flex circuit is provided. The card edge connector includes a housing having a front, a top and a bottom. The housing has a slot between the top and the bottom. The slot is open at the front. The slot is configured to receive a flex circuit therein. Upper contacts are held by the housing between the slot and the top. The upper contacts are exposed in the slot for mating with an upper surface of the flex circuit. Lower contacts are held by the housing between the slot and the bottom. The lower contacts are exposed in the slot for mating with a lower surface of the flex circuit.

In another embodiment, a card edge connector system is provided having a flex circuit that has an upper surface and a lower surface. The flex circuit has an edge. The flex circuit has pads proximate to the edge on the upper surface and on the lower surface. A card edge connector includes a housing having a front, a top and a bottom. The housing has a slot between the top and the bottom. The slot is open at the front. The slot receives the flex circuit therein. Upper contacts are held by the housing between the slot and the top. The upper contacts are exposed in the slot for mating with corresponding pads on the upper surface of the flex circuit. Lower contacts are held by the housing between the slot and the bottom. The lower contacts are exposed in the slot for mating with corresponding pads on the lower surface of the flex circuit.

In a further embodiment, a connector system is provided including a flex circuit having an upper surface and an opposite lower surface. The flex circuit has upper pads arranged on the upper surface and lower pads arranged on the lower surface. The upper pads are configured to be engaged by and electrically connected to corresponding contacts of the system. The lower pads are configured to be engaged by and electrically connected to corresponding contacts of the system.

DETAILED DESCRIPTION OF THE INVENTION

Figure 1:
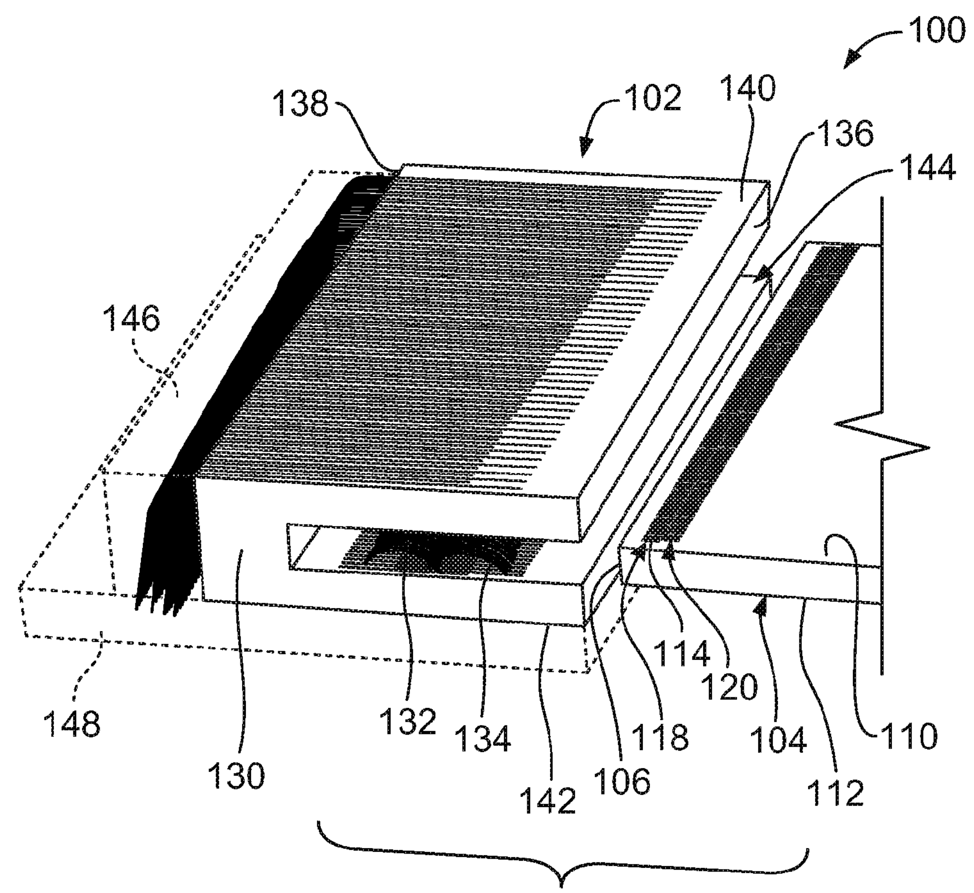
FIG. 1 is a top perspective view of a card edge connector system formed in accordance with an exemplary embodiment.

FIG. 1 is a top perspective view of a card edge connector system 100 formed in accordance with an exemplary embodiment. The card edge connector system 100 includes a card edge connector 102 and a flex circuit 104 that is configured to be received in the card edge connector 102. The card edge connector 102 is configured to mate to both sides of the flex circuit 104.

Having the card edge connector 102 mate to both sides of the flex circuit 104 increases the density of the card edge connector system 100. For example, a greater number of electrical connections are made per unit length of the flex circuit 104 along an edge 106 of the flex circuit 104.

The flex circuit 104 includes an upper surface 110 and a lower surface 112 opposite the upper surface 110. The upper and lower surfaces 110, 112 are generally perpendicular with respect to the edge 106. A plurality of upper pads 114 are provided on the upper surface 110 proximate to the edge 106. Similarly, a plurality of lower pads 116 (shown in FIG. 2) are provided on the lower surface 112. In an exemplary embodiment, the upper pads 114 and the lower pads 116 are provided on a very tight pitch, thereby defining a high density connector interface.

In an exemplary embodiment, the upper pads 114 and the lower pads 116 are staggered allowing the upper pads 114 and the lower pads 116 to be arranged at a tight pitch. The upper pads 114 and the lower pads 116 may be very thin pads and may be manufactured to very tight tolerances. Optionally, the upper pads 114 and lower pads 116 may be etched to very tight tolerances, such as within a few microns. In an exemplary embodiment, the upper pads 114 and the lower pads 116 are approximately 3 mil thick pads and the upper pads 114 and the lower pads 116 are provided on a 6 mil pitch.

In an exemplary embodiment, the upper pads 114 and the lower pads 116 are arranged in two rows, namely a front row 118 and a back row 120. The front row 118 is positioned closer to the edge 106. The back row 120 is positioned further from the edge 106. More than two rows may be provided in alternative embodiments. In other alternative embodiments, the upper pads 114 and the lower pads 116 may be provided in a single row. In an exemplary embodiment, each adjacent pad 114, 116 is provided in a different row such that one pad is in the front row 118 and the next pad is in the back row 120. Optionally, the upper pads 114 may be arranged directly across the flex circuit 104 from corresponding lower pads 116 such that the contacts 132, 134 impart opposing forces on the flex circuit 104.

In an exemplary embodiment, the flex circuit 104 may be semi-rigid at the mating end of the flex circuit 104. For example, the mating end of the flex circuit 104 may be reinforced or stiffened with reinforcement elements, such as RF4 material, to stiffen the mating end of the flex circuit 104 for loading into the card edge connector 102. Optionally, only a portion of the mating end may be stiffened with the reinforcement elements, such as only the portion of the flex circuit 104 that is received in the card edge connector 102. The remainder of the flex circuit 104 may be more flexible than the mating end. Optionally, the flex circuit 104 may wrap around a rigid plate such that the rigid plate is positioned between two layers of the flex circuit 104 to stiffen the mating end for loading into the card edge connector 102.

The card edge connector 102 includes a dielectric housing 130 that holds a plurality of upper contacts 132 and lower contacts 134. The upper contacts 132 are configured to engage the upper pads 114 while the lower contacts 134 are configured to the lower pads 116 when the flex circuit 104 is loaded into the card edge connector 102. The housing 130 includes a front 136, a rear 138, a top 140 and a bottom 142. The housing 130 has a slot 144 positioned between the top 140 and the bottom 142. The slot 144 is open at the front 136. The slot 144 receives the mating end of the flex circuit 104.

The upper contacts 132 are held by the housing 130 between the slot 144 and the top 140. The upper contacts 132 are exposed in the slot 144 for mating with the upper pads 114 on the upper surface 110 of the flex circuit 104. The lower contacts 134 are held by the housing 130 between the slot 144 and the bottom 142. The lower contacts 134 are exposed in the slot 144 for mating with the lower pads 116 on the lower surface 112 of the flex circuit 104. In an exemplary embodiment, the upper contacts 132 and the lower contacts 134 extend externally from the housing 130 beyond the rear 138. Optionally, a contact organizer 146 may be used to hold the upper contacts 132 and the lower contacts 134 where the upper contacts 132 and the lower contacts 134 exit the housing 130. The contact organizer 146 keeps the upper contacts 132 and the lower contacts 134 electrically separated from one another. The contact organizer 146 may be used to hold the upper contacts 132 and the lower contacts 134 for termination to an electrical component 148 (represented schematically in FIG. 1). The electrical component 148 may be a circuit board, an integrated circuit component, a chip, a processor, another flex circuit, or any other type of electrical component 148.

Figure 2:
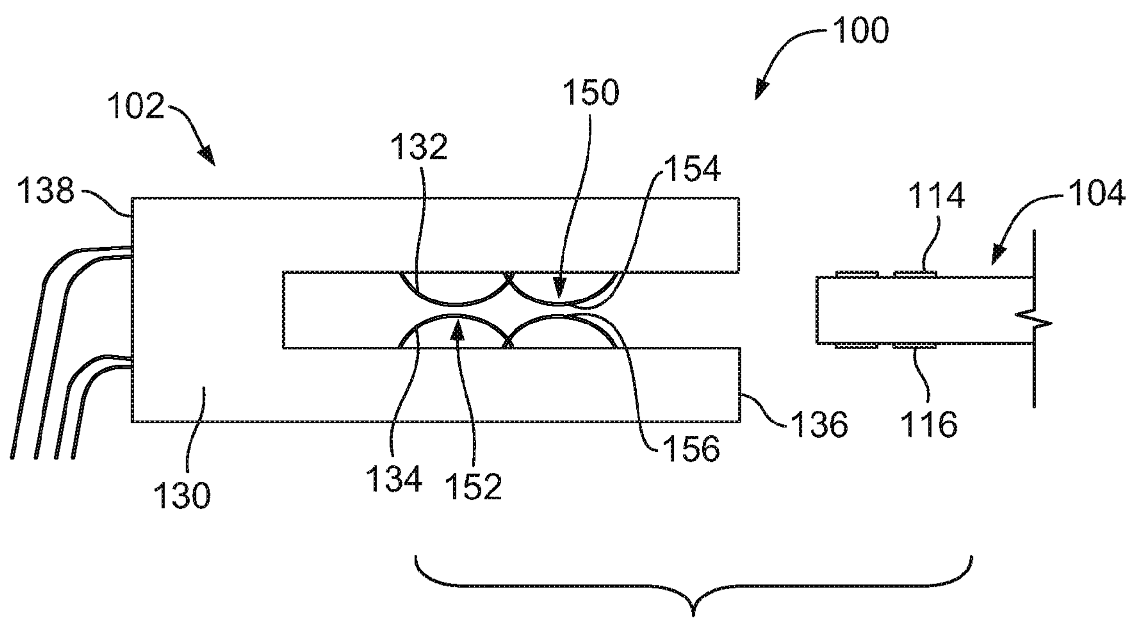
FIG. 2 is a side view of the card edge connector system showing a flex circuit poised for loading into a card edge connector.

FIG. 2 is a side view of the card edge connector system 100 showing the flex circuit 104 poised for loading into the card edge connector 102. In an exemplary embodiment, the upper contacts 132 and the lower contacts 134 are both arranged in a staggered configuration such that some of the contacts 132, 134 are closer to the front 136 and some of the contacts 132, 134 are closer to the rear 138. In the illustrated embodiment, the upper and lower contacts 132, 134 are arranged in a front row 150 and a back row 152. The upper and lower contacts 132, 134 may be arranged in more than two rows in alternative embodiments. In other alternative embodiments, the upper and lower contacts 132, 134 may be arranged in a single row.

The upper contacts 132 have mating interfaces 154 configured to engage corresponding upper pads 114 on a flex circuit 104. The lower contacts 134 have mating interfaces 156 configured to engage corresponding lower pads 116 on a flex circuit 104. The upper contacts 132 are staggered with the mating interfaces 154 of the upper contacts 132 in the front row 150 being closer to the front 136 and with the mating interfaces 154 of the upper contacts 132 in the back row 152 closer to the rear 138. The mating interfaces 154 are arranged at different depths from the front 136 with the mating interfaces 154 of the upper contacts 132 in the front row 150 being closer to the front 136 and with the mating interfaces 154 of the upper contacts 132 in the back row 152 further from the front 136. The lower contacts 134 are staggered with the mating interfaces 156 of the lower contacts 134 in the front row 150 being closer to the front 136 and with the mating interfaces 156 of the lower contacts 134 in the back row 152 closer to the rear 138. The mating interfaces 156 are arranged at different depths from the front 136 with the mating interfaces 156 of the lower contacts 134 in the front row 150 being closer to the front 136 and with the mating interfaces 156 of the lower contacts 134 in the back row 152 further from the front 136. Having the upper and lower contacts 132, 134 staggered may reduce the loading force required to load the flex circuit 104 into the card edge connector 102. Having the upper contacts 132 and the lower contacts 134 staggered may allow the card edge connector 102 to have a higher density. For example, staggering the upper contacts 132 and the lower contacts 134 positions adjacent contacts further apart from one another, which may have an impact on the electrical characteristics of the contacts, such as reducing cross-talk.

In an exemplary embodiment, at the rear 138, the upper contacts 132 may be staggered at the exit point of the housing 130. For example, the upper contacts 132 associated with the front row 150 may be vertically and/or horizontally offset with respect to the upper contacts 132 associated with the back row 152. Similarly, the lower contacts 134 associated with the front row 150 may be vertically and/or horizontally offset with respect to the lower contacts 134 associated with the back row 152. The contact organizer 146 (shown in FIG. 1) may be used to control the relative positions of the upper contacts 132 and the lower contacts 134 at the exit from the housing 130.

Figure 3:
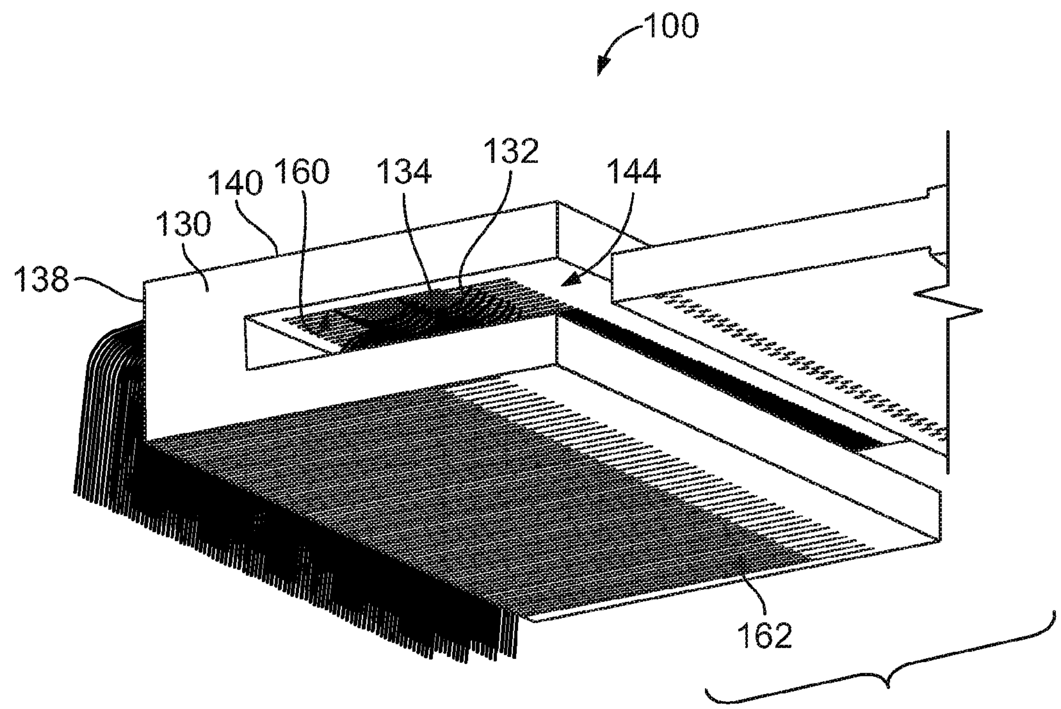
FIG. 3 is a bottom perspective view of the card edge connector system shown in FIG. 1.

FIG. 3 is a bottom perspective view of the card edge connector system 100. The housing 130 includes a plurality of upper contact channels 160 that hold corresponding upper contacts 132. The housing 130 includes a plurality of lower contact channels 162 that hold corresponding lower contacts 134. In an exemplary embodiment, the upper contact channels 160 are open at the top 140 and at the rear 138. The upper contact channels 160 are also open to the slot 144. The upper contacts 132 may be loaded into the upper contact channels 160 through the top 140 and/or the rear 138. The upper contacts 132 are loaded into the upper contact channels 160 such that the upper contacts 132 extend into the slot 144. In an exemplary embodiment, the upper contacts 132 are loaded into the upper contact channels 160 by a machine during a manufacturing process. For example, the upper contacts 132 may be preformed and loaded into the housing 130 by a pick-and-place machine.

In an alternative embodiment, the upper contacts 132 may be loaded into the housing 130 by alternative means, such as by stitching the upper contacts 132 into the housing 130. In such embodiments, the upper contact channels 160 may not be preformed in the housing 130, but rather the upper contact channels 160 may be formed during loading of the upper contacts 132 into the housing 130.

In other alternative embodiments, the housing 130 may be molded over the upper contacts 132. For example, the upper contacts 132 may be fixed in place in a mold and then the housing 130 may be overmolded over the upper contacts 132. Similarly, the housing 130 may be molded over the lower contacts 134. For example, the lower contact 134 may be fixed in place in a mold and then the housing 130 may be overmolded over the lower contact 134. The housing 130 may be overmolded over the upper contacts 132 and the lower contacts 134 during a common molding process. Alternatively, the housing 130 may be a two-part housing with an upper portion of the housing 130 overmolded over the upper contacts 132 and a lower portion of the housing 130 overmolded over the lower contacts 134 where the upper housing and the lower housing are coupled together during a later assembly step.

Figure 4:
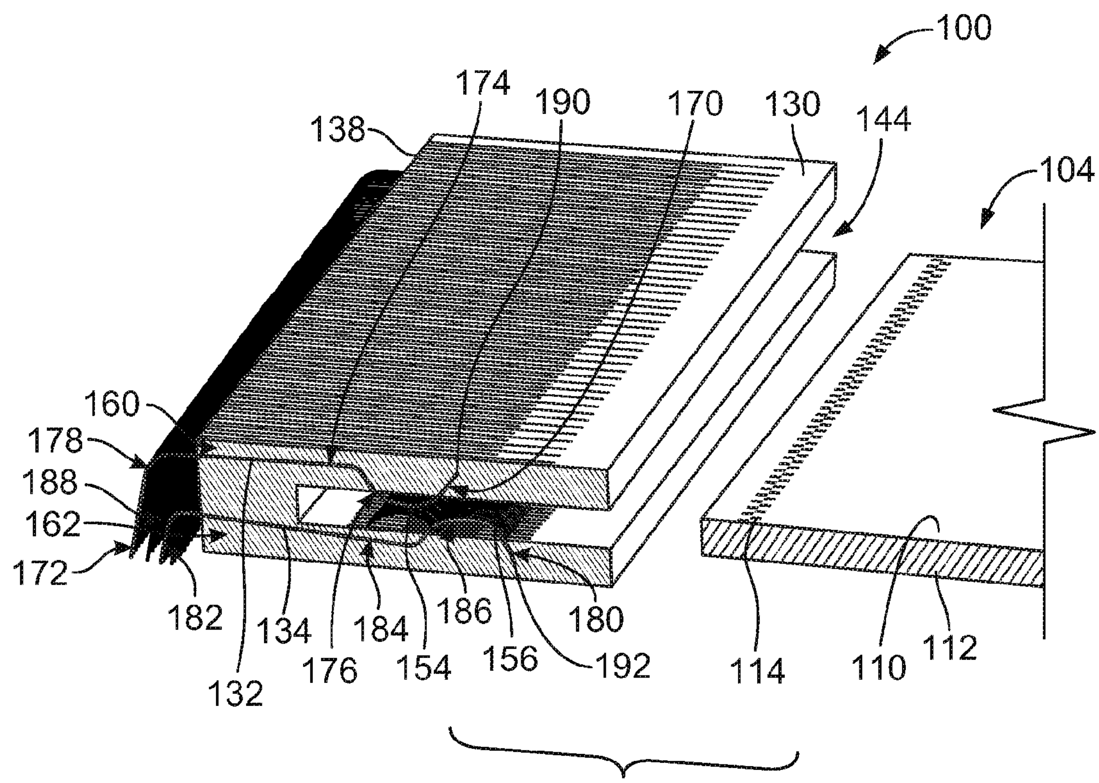
FIG. 4 is a partial cut away view of the card edge connector system showing an interior portion of the housing and showing an upper contact and a lower contact in the housing.

FIG. 4 is a partial cut away view of the card edge connector system 100 showing an interior portion of the housing 130 and showing an upper contact 132 and a lower contact 134 in the housing 130. In the illustrated embodiment, the upper and lower contacts 132, 134 are wire contacts and may be referred to hereinafter as upper wire contact 132 and lower wire contact 134, respectively or simply wire contacts 132, 134, respectively. The wire contacts 132, 134 are manufactured from a drawn wire. The wire contacts 132, 134 may have a circular cross-section or a rectangular cross-section. The wire contacts 132, 134 may have a diameter or thickness less than approximately 3 mil. The wire contacts 132, 134 may have a width dimension (e.g. side-to-side) that is less than contacts that are stamped and formed due to manufacturing tolerances of stamped and formed contacts. The wire contacts 132, 134 may have a width that is more uniform along the length thereof than stamped and formed contacts. The wire contacts 132, 134 may be bent or formed into a spring contact shape that allows the wire contacts 132, 134 to be spring biased and impose a spring force against the flex circuit 104. Other types of contacts other than wire contacts may be used in other embodiments, such as conductive beams. The small size of the contacts 132, 134 allows mating to the flex circuit 104 without having an appreciable negative effect on the flex circuit 104, such as warping or compressing the flex circuit 104. The small size of the contacts 132, 134 allows for tight spacing of the contacts 132, 134 to provide a high number of terminations to the flex circuit 104.

The upper contact 132 includes a mating end 170 and a terminating end 172. The mating interface 154 at the mating end 170 defines a separable interface configured to mate with, and unmate from, the upper surface 110 of the flex circuit 104. The terminating end 172 is configured to be terminated to the electrical component 148 (shown in FIG. 1). The upper contact 132 includes a housing portion 174, a slot portion 176 and a transition portion 178. The housing portion 174 is the portion of the upper contact 132 that is routed through and surrounded by the dielectric material of the housing 130. More than one housing portion 174 may be provided. For example, a housing portion 174 may be provided on both sides of the slot portion 176.

The slot portion 176 is the portion of the upper contact 132 that extends into the slot 144. The slot portion 176 is exposed in the slot 144. The slot portion 176 defines the mating interface 154 that engages the upper pad 114. The slot portion 176 is provided at the mating end 170.

The transition portion 178 is the portion of the upper contact 132 that extends rearward from the rear 138 of the housing 130. The transition portion 178 is provided at the terminating end 172. The transition portion 178 may be received in the contact organizer 146 (shown in FIG. 1). The transition portion 178 transitions from the housing 130 to the electrical component 148 (shown in FIG. 1). The transition portion 178 may be bent or manipulated to an area remote from the housing 130 for terminating to the electrical component 148.

In an exemplary embodiment, the upper contact 132 includes a tip 190 at the mating end 170. The tip 190 is positioned forward of the slot portion 176. The tip 190 is received in the housing 130. The upper contact 132 may transition from the slot 144 back into the upper contact channel 160. Having the tip 190 in the housing 130 reduces the chance for stubbing when the flex circuit 104 is loaded into the slot 144.

The lower contact 134 includes a mating end 180 and a terminating end 182. The mating interface 156 at the mating end 180 defines a separable interface configured to mate with, and unmate from, the lower surface 112 of the flex circuit 104. The terminating end 182 is configured to be terminated to the electrical component 148 (shown in FIG. 1). The lower contact 134 includes a housing portion 184, a slot portion 186 and a transition portion 188. The housing portion 184 is the portion of the lower contact 134 that is routed through and surrounded by the dielectric material of the housing 130. More than one housing portion 184 may be provided. For example, a housing portion 184 may be provided on both sides of the slot portion 186.

The slot portion 186 is the portion of the lower contact 134 that extends into the slot 144. The slot portion 186 is exposed in the slot 144. The slot portion 186 defines the mating interface 156 that engages the lower pad 116. The slot portion 186 is provided at the mating end 180.

The transition portion 188 is the portion of the lower contact 134 that extends rearward from the rear 138 of the housing 130. The transition portion 188 is provided at the terminating end 182. The transition portion 188 may be received in the contact organizer 146 (shown in FIG. 1). The transition portion 188 transitions from the housing 130 to the electrical component 148 (shown in FIG. 1). The transition portion 188 may be bent or manipulated to an area remote from the housing 130 for terminating to the electrical component 148.

In an exemplary embodiment, the lower contact 134 includes a tip 192 at the mating end 180. The tip 192 is positioned forward of the slot portion 186. The tip 192 is received in the housing 130. The lower contact 134 may transition from the slot 144 back into the lower contact channel 162. Having the tip 192 in the housing 130 reduces the chance for stubbing when the flex circuit 104 is loaded into the slot 144.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A card edge connector for mating to a flex circuit, the card edge connector comprising:

a housing having a front, a top and a bottom, the housing having a slot between the top and the bottom, the slot being open at the front, the slot being configured to receive the flex circuit therein;

upper contacts held by the housing between the slot and the top, the upper contacts being exposed in the slot for mating with an upper surface of the flex circuit, the upper contacts being wire contacts having a uniform cross-sectional area along a length of the corresponding upper contact; and lower contacts held by the housing between the slot and the bottom, the lower contacts being exposed in the slot for mating with a lower surface of the flex circuit, the lower contacts being wire contacts having a uniform cross-sectional area along a length of the corresponding lower contact.

2. The card edge connector of claim 1, wherein the upper and lower contacts oppose each other and are deflectable away from each other when the flex circuit is received in the slot.

3. The card edge connector of claim 1, wherein the upper contacts include mating ends defining a separable interface configured to mate with, and unmate from, the flex circuit, the lower contacts include mating ends defining a separable interface configured to mate with, and unmate from, the flex circuit.

4. The card edge connector of claim 1, wherein the housing includes a plurality of upper contact channels holding corresponding upper contacts and a plurality of lower contact channels holding corresponding lower contacts, the upper contact channels being open through the top to receive the upper contacts through the top, the lower contact channels being open through the bottom to receive the lower contacts through the bottom.

5. The card edge connector of claim 1, wherein the housing is molded around the upper and lower contacts.

6. The card edge connector of claim 1, wherein the wire contacts have a circular cross-section.

7. The card edge connector of claim 1, wherein the upper contacts have mating interfaces, the upper contacts being staggered in at least two rows such that the mating interfaces are positioned at different depths from the front, the lower contacts having mating interfaces, the lower contacts staggered in at least two rows such that the mating interfaces are positioned at different depths from the front.

8. The card edge connector of claim 1, further comprising a contact organizer positioned at a rear of the housing, the contact organizer holding the relative positions of the upper contacts and lower contacts for termination to an electrical component.

9. The card edge connector of claim 1, wherein the upper contacts extend between mating ends and terminating ends, the mating ends being configured to be mated to the flex circuit, the terminating ends being configured to be terminated to an electrical component, the mating ends having tips held inside the housing remote from the slot.

10. A card edge connector system comprising:

a flex circuit having an upper surface and a lower surface, the flex circuit having an edge, the flex circuit having pads proximate to the edge on the upper surface and on the lower surface; and a card edge connector comprising:

a housing having a front, a top and a bottom, the housing having a slot between the top and the bottom, the slot being open at the front, the slot receiving the flex circuit therein;

upper contacts held by the housing between the slot and the top, the upper contacts being exposed in the slot for mating with corresponding pads on the upper surface of the flex circuit, the upper contacts being wire contacts having a uniform cross-sectional area along a length of the corresponding upper contact; and lower contacts held by the housing between the slot and the bottom, the lower contacts being exposed in the slot for mating with corresponding pads on the lower surface of the flex circuit, the lower contacts being wire contacts having a uniform cross-sectional area along a length of the corresponding lower contact.

11. The card edge connector system of claim 10, wherein the upper and lower contacts oppose each other and are deflectable away from each other when the flex circuit is received in the slot.

12. The card edge connector system of claim 10, wherein the housing includes a plurality of upper contact channels holding corresponding upper contacts and a plurality of lower contact channels holding corresponding lower contacts, the upper contact channels being open through the top to receive the upper contacts through the top, the lower contact channels being open through the bottom to receive the lower contacts through the bottom.

13. The card edge connector system of claim 10, wherein the housing is molded around the upper and lower contacts.

14. The card edge connector system of claim 10, wherein the pads on the upper surface are staggered at different depths from the edge of the flex circuit and the pads on the lower surface are staggered at different depths from the edge of the flex circuit, and wherein the upper contacts have mating interfaces, the upper contacts being staggered in at least two rows such that the mating interfaces are positioned at different depths from the front for engaging corresponding pads on the upper surface of the flex circuit, the lower contacts having mating interfaces, the lower contacts staggered in at least two rows such that the mating interfaces are positioned at different depths from the front for engaging corresponding pads on the lower surface of the flex circuit.

15. The card edge connector system of claim 10, further comprising a contact organizer positioned at a rear of the housing, the contact organizer holding the relative positions of the upper contacts and lower contacts for termination to an electrical component.

16. The card edge connector system of claim 10, wherein the upper contacts extend between mating ends and terminating ends, the mating ends being configured to be mated to the flex circuit, the terminating ends being configured to be terminated to an electrical component, the mating ends having tips held inside the housing remote from the slot.

17. A card edge connector for mating to a flex circuit, the card edge connector comprising:

a housing having a front, a top and a bottom, the housing having a slot between the top and the bottom, the slot being open at the front, the slot being configured to receive the flex circuit therein;

upper contacts held by the housing between the slot and the top, the upper contacts extend between mating ends and terminating ends, segments of the mating ends being exposed in the slot for mating with an upper surface of the flex circuit, segments of the terminating ends extending from the housing for termination to an electrical component; and lower contacts held by the housing between the slot and the bottom, the lower contacts extend between mating ends and terminating ends, segments of the mating ends being exposed in the slot for mating with a lower surface of the flex circuit, segments of the terminating ends extending from the housing for termination to an electrical component;

wherein the housing defines an overmolded housing molded around the upper and lower contacts, segments of the upper and lower contacts between the corresponding mating and terminating ends being molded into the overmolded housing and captured in the overmolded housing to hold the relative positions of the upper and lower contacts;

wherein the upper contacts are wire contacts having a uniform cross-sectional area along a length of the corresponding upper contact and wherein the lower contacts are wire contacts having a uniform cross-sectional area along a length of the corresponding upper contact.

18. The card edge connector of claim 17, wherein the mating ends extend to tips, the tips of the upper and lower contacts being molded into the housing and captured in the housing to hold the relative positions of the upper and lower contacts.

19. The card edge connector of claim 17, wherein the housing comprises an upper housing and a lower housing separate and discrete from the upper housing, the upper housing being molded around the upper contacts, the lower housing being molded around the lower contacts, the upper and lower housings being coupled together.

* * * * *